US012088286B2

(12) United States Patent
Liu et al.

(10) Patent No.: US 12,088,286 B2
(45) Date of Patent: Sep. 10, 2024

(54) TEMPERATURE SENSORS

(71) Applicant: TEXAS INSTRUMENTS INCORPORATED, Dallas, TX (US)

(72) Inventors: Chengxi Liu, Austin, TX (US); Roy Alan Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 483 days.

(21) Appl. No.: 17/364,206

(22) Filed: Jun. 30, 2021

(65) Prior Publication Data
US 2023/0006666 A1    Jan. 5, 2023

(51) Int. Cl.
| | |
|---|---|
| *H03K 17/14* | (2006.01) |
| *G01K 7/01* | (2006.01) |
| *H01L 21/8222* | (2006.01) |
| *H01L 29/417* | (2006.01) |
| *H01L 29/73* | (2006.01) |
| *G05F 3/22* | (2006.01) |
| *G05F 3/24* | (2006.01) |

(52) U.S. Cl.
CPC ............... *H03K 17/14* (2013.01); *G01K 7/01* (2013.01); *H01L 21/8222* (2013.01); *H01L 29/41708* (2013.01); *G05F 3/225* (2013.01); *G05F 3/242* (2013.01); *H01L 29/73* (2013.01)

(58) Field of Classification Search
CPC .......... G01K 7/01; G01K 7/015; H03K 17/14; H01L 21/8222; H01L 29/73; H01L 29/41708; G05F 3/225; G05F 3/242
See application file for complete search history.

(56) References Cited

U.S. PATENT DOCUMENTS 3,847,687 A * 11/1974 Davidsohn ............ H01L 21/00
                                                       148/DIG. 115
3,906,310 A    9/1975 Esashika
(Continued)

FOREIGN PATENT DOCUMENTS

EP        0617497 B1    11/1997

OTHER PUBLICATIONS

Aiello et al., "On the Susceptibility of Embedded Thermal Shutdown Circuit to Radio Frequency Interference," IEEE Transactions on Electromagnetic Compatibility, vol. 54, Issue: 2, Apr. 2012, pp. 405-412.

(Continued)

*Primary Examiner* — Randy W Gibson
(74) *Attorney, Agent, or Firm* — Ray A. King; Frank D. Cimino

(57) ABSTRACT

In examples, a circuit comprises a first current source coupled to a voltage source node. The circuit comprises a resistor having a first resistor terminal and a second resistor terminal, where the first resistor terminal is coupled to the first current source. The circuit comprises a bipolar transistor having a base, a collector, and an emitter, with the base coupled to the first resistor terminal, the emitter coupled to the second resistor terminal, and the collector coupled to the voltage source node. The circuit comprises a second current source coupled to the emitter and the second resistor terminal, with the second current source coupled to a ground node. The circuit comprises a Schmitt trigger having an input coupled to the emitter, the second resistor terminal, and the second current source.

20 Claims, 3 Drawing Sheets

(56) References Cited

U.S. PATENT DOCUMENTS

| | | | |
|---|---|---|---|
| 4,092,693 A | | 5/1978 | Ishikawa et al. |
| 4,146,903 A | | 3/1979 | Dobkin |
| 4,345,218 A | | 8/1982 | Congdon et al. |
| 4,574,205 A | | 3/1986 | Nagano |
| 4,667,265 A | | 5/1987 | Stanojevic et al. |
| 4,669,026 A | | 5/1987 | Widlar |
| 4,774,204 A | * | 9/1988 | Havemann .......... H01L 21/8249 |
| | | | 148/DIG. 147 |
| 5,063,342 A | | 11/1991 | Hughes et al. |
| 5,099,381 A | | 3/1992 | Wilcox |
| 5,194,926 A | * | 3/1993 | Hayden ............. H01L 29/41708 |
| | | | 257/E21.375 |
| 5,206,778 A | | 4/1993 | Flynn et al. |
| 5,550,682 A | * | 8/1996 | Seo ........................ G11B 19/12 |
| 5,737,170 A | | 4/1998 | Moyer |
| 5,796,280 A | | 8/1998 | Tuozzolo |
| 5,838,187 A | | 11/1998 | Embree |
| 5,838,578 A | | 11/1998 | Pippin |
| 5,946,181 A | | 8/1999 | Gibson |
| 5,980,106 A | | 11/1999 | Yamamoto et al. |
| 6,016,051 A | * | 1/2000 | Can ........................... G05F 3/30 |
| | | | 323/907 |
| 6,816,351 B1 | | 11/2004 | Frank et al. |
| 7,454,640 B1 | | 11/2008 | Wong |
| 2021/0305379 A1 | * | 9/2021 | Zhou ................... H01L 29/7371 |
| 2023/0266785 A1 | * | 8/2023 | Wang ...................... G05F 3/262 |
| | | | 323/313 |

OTHER PUBLICATIONS

Bin et al., "A Novel Thermal-Shutdown Protection Circuit," Int. Conf. Anti-Counterfeiting, Security, and Identification in Communication, 2009, 4 p.

Nagel et al., "Integrated 1 V Thermal Shutdown Circuit," Electronics Lett., vol. 28, #10, p. 969ff, 1992. Abstract—1 p.

Riedijk et al., "An Integrated Absolute Temperature Sensor With Digital Output," Transducers '91: 1991, International Conference on Solid-State Sensors and Actuators, Jun. 24-27, 1991, pp. 479-482.

Vogt et al., "Integrated Temperature Sensor With Digital Output for SoC Power Management," 2007 International Conference on Design & Technology of Integrated Systems in Nanoscale Era, Sep. 2-5, 2007, pp. 7-12.

PCT International Search Report, PCT/US2022/035200, dated Sep. 28, 2022, 4 sheets.

* cited by examiner

TEMPERATURE SENSORS

BACKGROUND

Many types of circuits, such as switching power circuits, operate at high temperatures. Excessively high temperatures can damage the circuit. Thus, thermal protection devices are useful to monitor the temperature of the circuit. Responsive to the temperature of the circuit exceeding a threshold, the thermal protection device acts to prevent damage to the circuit. For example, the thermal protection device deactivates the circuit until the circuit has adequately cooled.

SUMMARY

In examples, a circuit comprises a first current source coupled to a voltage source node. The circuit comprises a resistor having a first resistor terminal and a second resistor terminal, where the first resistor terminal is coupled to the first current source. The circuit comprises a bipolar transistor having a base, a collector, and an emitter, with the base coupled to the first resistor terminal, the emitter coupled to the second resistor terminal, and the collector coupled to the voltage source node. The circuit comprises a second current source coupled to the emitter and the second resistor terminal, with the second current source coupled to a ground node. The circuit comprises a Schmitt trigger having an input coupled to the emitter, the second resistor terminal, and the second current source.

In examples, a circuit comprises a first current source coupled to a voltage source node; a resistor coupled to the first current source; a second current source coupled to the resistor and coupled to a ground node; a Schmitt trigger coupled to the second current source and coupled to the voltage source node; and a bipolar transistor. The bipolar transistor includes an emitter including an n-doped region and an emitter contact coupled to the n-doped region, the emitter contact coupled to the resistor, the second current source, and the Schmitt trigger. The bipolar transistor includes a base abutting the emitter and including a p-doped epitaxial layer, a p-doped buried layer, a p-doped well positioned in the p-doped epitaxial layer, and a base contact coupled to the p-doped well, the base contact coupled to the first current source and the resistor. The bipolar transistor includes a collector abutting the base, the base separating the collector from the emitter, the collector including an n-doped buried layer, a first n-doped well, and a collector contact coupled to the first n-doped well, the collector contact coupled to the voltage source node. The bipolar transistor includes a substrate layer abutting the n-doped buried layer.

In examples, a system comprises a thermal protection device, a switching power circuit coupled to the thermal protection device, and a temperature sensing circuit positioned inside the switching power circuit. The temperature sensing circuit includes a bipolar transistor having a base, an emitter, and a collector, the collector coupled to a voltage source node. The circuit includes a first current source coupled to the base and coupled to the voltage source node. The circuit includes first and second resistors coupled to the base. The circuit includes a Schmitt trigger coupled to the emitter and to an inverter. The circuit includes a transistor having a transistor gate, a transistor drain, and a transistor source, the transistor gate coupled to the inverter, the transistor drain coupled to the first and second resistors, the transistor source coupled to the second resistor and the emitter. The circuit includes a current mirror coupled to the second resistor, the emitter, and the transistor source, the current mirror coupled to a ground node. The circuit includes a second current source coupled to the current mirror and coupled to the voltage source node.

DETAILED DESCRIPTION

Figure 1:
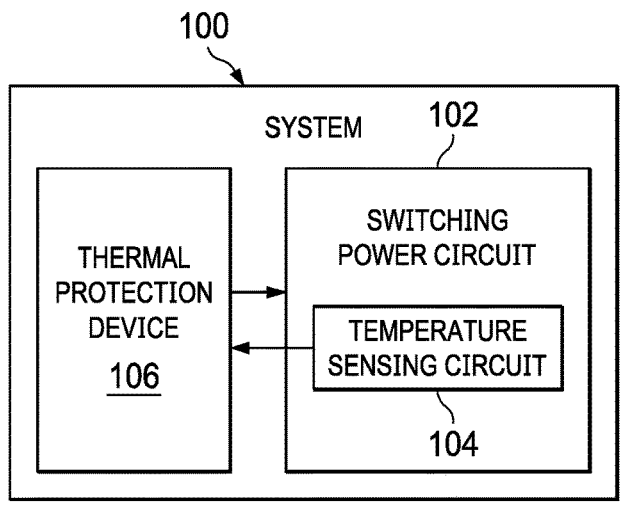
FIG. 1 is a block diagram of an example system implementing a temperature sensing circuit in various examples.

The thermal protection device described above may include or be coupled to a temperature sensor. The temperature sensor senses the temperature of the circuit that is to be protected from excessively high temperatures. Responsive to detecting a temperature that exceeds a threshold, the temperature sensor provides an alert signal to the thermal protection device, which takes mitigating action to preventing overheating of the circuit. Such temperature sensors often include bipolar junction transistors (BJTs). A parameter of the BJT, such as the base-emitter voltage of the BJT, varies with temperature, and this parameter is used as a proxy to determine the temperature of the circuit to be protected.

Some BJT structures suffer from design limitations that may negatively impact temperature sensing accuracy. For instance, the collector of the BJT may abut the substrate of the BJT at a junction. The junction is reverse biased to isolate the collector from the substrate and to prevent majority-carrier current flow from the substrate to the collector, because such current flow would adversely impact the operation of other components coupled to the collector and result in poor temperature sensing performance. In certain applications, including switching power applications, a relatively large concentration of minority carriers may exist in the substrate, and the reverse biasing between the collector and the substrate will not preclude these minority carriers from crossing the collector-substrate junction into the collector. The number of minority carriers entering the collector may be sufficiently large so as to adversely impact the operation of other components (e.g., comparators) coupled to the collector and result in poor temperature sensing performance. Furthermore, the substrate is capacitively coupled to the collector through the collector-substrate junction, and this capacitance at the collector-substrate junction couples substrate noise (e.g., large fluctuations in substrate voltage) into the collector. The substrate noise manifests in the collector as current, and as described above, currents entering the collector can adversely impact temperature sensing accuracy.

This description provides various examples of a temperature sensor that remedies the challenges described above. The temperature sensor described herein may be useful in high-temperature applications, such as switching power applications. The temperature sensor includes a first current source adapted to be coupled to a voltage source. The temperature sensor includes a resistor having a first resistor terminal and a second resistor terminal, with the first resistor terminal coupled to the first current source. The temperature sensor includes an npn-BJT (which, in some examples, may be a pnp-BJT) having a base, a collector, and an emitter, with the base coupled to the first resistor terminal, the emitter coupled to the second resistor terminal, and the collector adapted to be coupled to the voltage source. The temperature sensor includes a second current source coupled to the emitter and the second resistor terminal, with the second current source adapted to be coupled to ground. The temperature sensor includes a Schmitt trigger (or other component configured to convert an analog signal at the emitter into a digital signal, such as a comparator, multiple comparators to provide hysteresis, etc.) having an input coupled to the emitter, the second resistor terminal, and the second current source. The npn-BJT includes a substrate, a collector abutting the substrate, a base abutting the collector, and an emitter abutting the base, so the substrate is separated from the emitter and base by the collector. Because the Schmitt trigger and current source described above are coupled to the emitter, and because the emitter is distanced from the substrate, the negative impacts caused by proximity to the substrate do not affect the base, the emitter, or the components (e.g., Schmitt trigger) coupled to the base or the emitter. Furthermore, although substrate noise and minority carriers may cross the collector-substrate junction, the collector is coupled to the voltage source through a relatively low impedance path. This low impedance permits the collector to source or sink displacement or minority-carrier currents crossing the collector-substrate junction without causing substantial variation in collector voltage and therefore without coupling substantial noise into either the base or the emitter of the transistor. Consequently, the substrate noise and minority carriers do not adversely impact other components in the temperature sensor and thus do not adversely impact temperature sensing accuracy. Various examples of the temperature sensor are now described with reference to FIGS. 1-5.

FIG. 1 is a block diagram of an example system implementing a temperature sensing circuit in various examples. In particular, FIG. 1 is an example system 100, such as a personal computer, smartphone, television, disc player, receiver, a virtual artificial intelligence assistant, or any other system including a device, component, or circuit for which temperature sensing may be useful. The system 100 includes a switching power circuit 102, which may operate at high temperatures, and for which temperature sensing may be useful. The scope of this description is not limited to temperature sensing for a switching power circuit. The temperature sensing circuit described herein may be useful to sense temperature for any device, component, or circuit in which temperature sensing may be useful. References to the switching power circuit 102 herein also apply to other such devices, components, or circuits in which temperature sensing would be useful.

The system 100 includes a temperature sensing circuit 104. In some examples, the temperature sensing circuit 104 is positioned inside the switching power circuit 102, meaning that the temperature sensing circuit 104 is physically positioned among the circuitry of the switching power circuit 102 without being coupled to the circuitry of the switching power circuit 102. The system 100 includes a thermal protection circuit 106 coupled to the temperature sensing circuit 104 and to the switching power circuit 102 (e.g., to an enable/disable input of the switching power circuit 102 configured to enable and disable the switching power circuit 102). In operation, the temperature sensing circuit 104 monitors the temperature of the switching power circuit 102 as switching power circuit 102 operates. Responsive to the temperature of the switching power circuit 102 remaining within a target range, the temperature sensing circuit 104 provides a first signal to the thermal protection circuit 106 that causes the thermal protection circuit 106 to permit the switching power circuit 102 to continue operation. Responsive to the temperature of the switching power circuit 102 leaving the target range by exceeding a threshold, the temperature sensing circuit 104 provides a second signal to the thermal protection circuit 106 that causes the thermal protection circuit 106 to perform a protective action, e.g., to temporarily disable the switching power circuit 102. In such cases, responsive to the temperature sensing circuit 104 determining that the temperature of the switching power circuit 102 has returned to the target range, the temperature sensing circuit 104 causes the thermal protection circuit 106 to enable the switching power circuit 102 to resume operation. Examples of the temperature sensing circuit 104 are described below.

Figure 2:
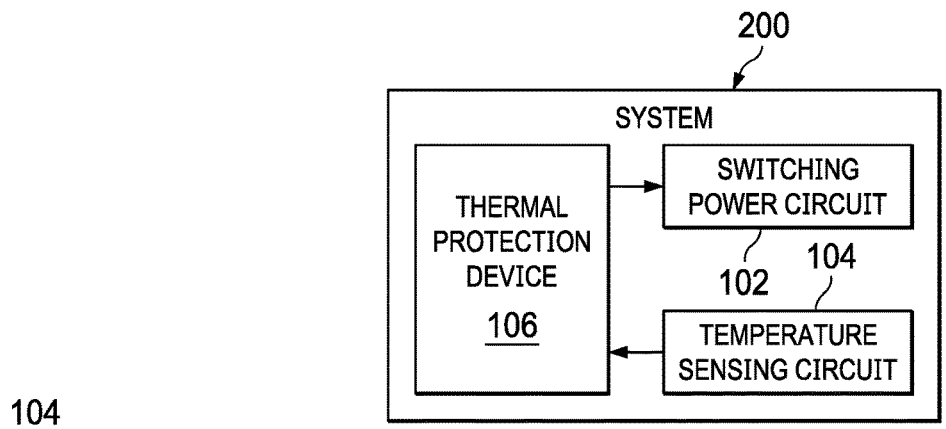
FIG. 2 is a block diagram of an example system implementing a temperature sensing circuit in various examples.

FIG. 2 is a block diagram of an example system 200 implementing a temperature sensing circuit in various examples. The system 200 is identical to the system 100 (FIG. 1), with the exception of the temperature sensing circuit 104 being positioned outside of the switching power circuit 102. Greater proximity of the temperature sensing circuit 104 to the switching power circuit 102 increases the amount of noise and minority carrier injection the switching power circuit 102 provides to the temperature sensing circuit 104. However, unlike other solutions, the temperature sensing circuit 104 described herein is not vulnerable to such increased noise and minority carrier injection, thus enabling the temperature sensing circuit 104 to be positioned inside the switching power circuit 102. By being positioned inside (or closer to) the switching power circuit 102 without being negatively impacted by the added noise and minority carrier injection, the temperature sensing circuit 104 increases the accuracy of its temperature measurements. In some examples, the temperature sensing circuit 104 itself may be divided so part of it is inside an area where heat is being generated and part of it is outside of the area where heat is being generated.

Figure 3:
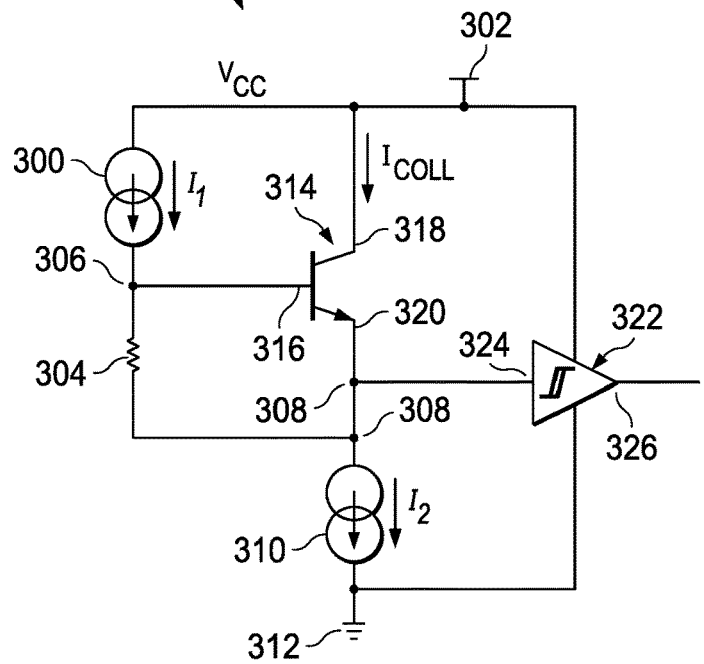
FIG. 3 is a circuit schematic diagram of a temperature sensing circuit in various examples.

FIG. 3 is a circuit schematic diagram of a temperature sensing circuit 104 in various examples. The example temperature sensing circuit 104 includes a current source 300 coupled to a voltage source 302. The voltage source 302 provides a voltage $V_{CC}$. The current source 300 is coupled to a first terminal of a resistor 304 at a node 306. A second terminal of the resistor 304 is coupled to a node 308. A current source 310 (e.g., one-quadrant current source) is coupled to the node 308 and to ground 312. The temperature sensing circuit 104 also includes a BJT 314 (e.g., an npn-BJT, although in some examples, a pnp-BJT may be useful for temperature sensing) having a base 316, a collector 318, and an emitter 320. The base 316 of the BJT 314 is coupled to the node 306. The collector 318 of the BJT 314 is coupled to the voltage source 302. The emitter 320 of the BJT 314 is coupled to the node 308. The temperature sensing circuit 104 also includes a Schmitt trigger 322 having an input 324 and an output 326. The input 324 is coupled to the node 308. The output 326 is adapted to be coupled to the thermal protection circuit 106 (FIGS. 1 and 2). A profile cross-sectional view of the BJT 314 is first described with reference to FIG. 4, followed by a description of the operation of the temperature sensing circuit 104.

Figure 4:
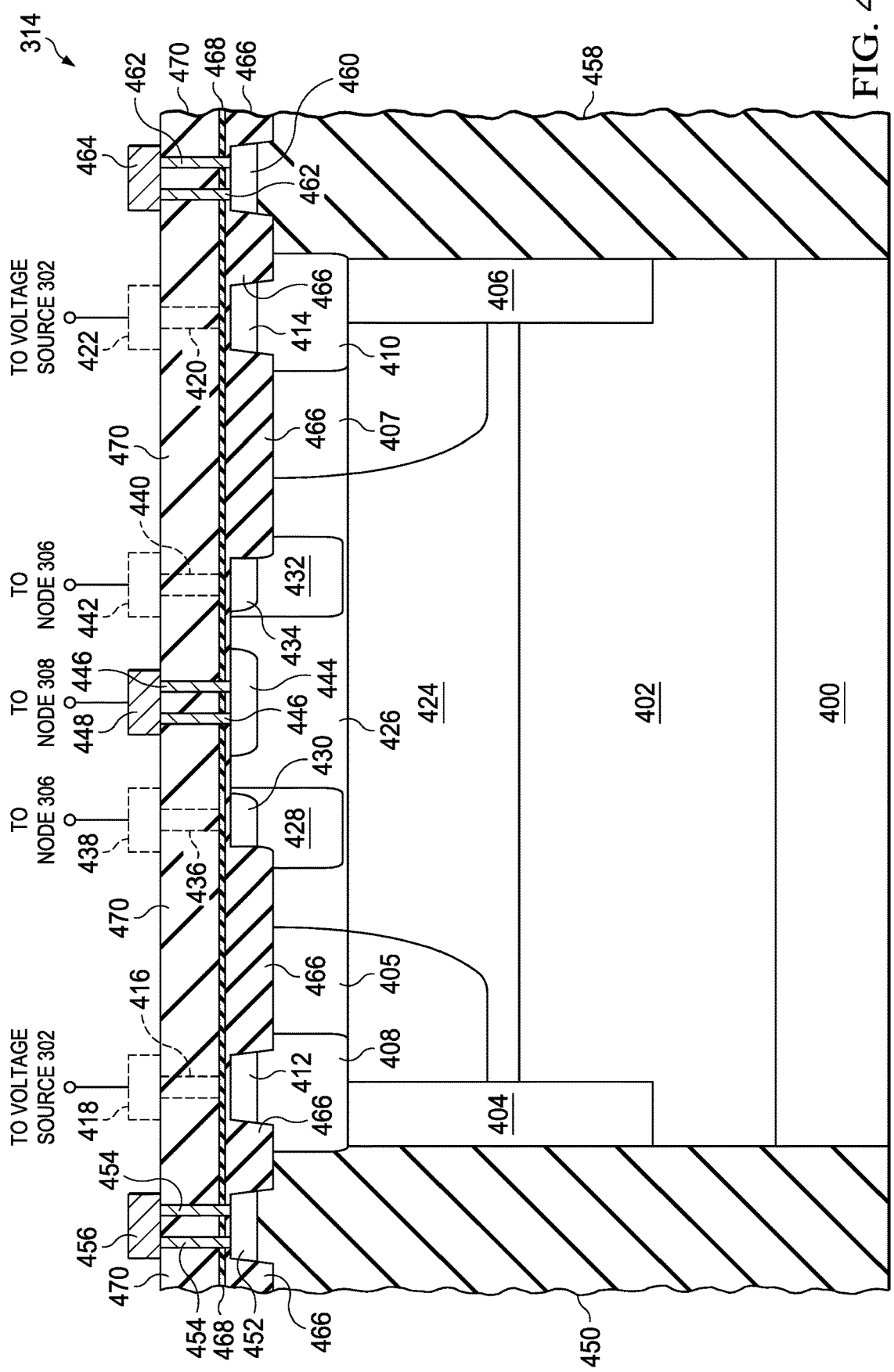
FIG. 4 is a profile cross-sectional view of a bipolar junction transistor in a temperature sensing circuit in various examples.

FIG. 4 is a profile cross-sectional view of the BJT 314 in the temperature sensing circuit 104 in various examples. The BJT 314 may include a substrate 400, which may include a lightly doped p-type upper portion and a heavily doped p-type lower portion. The BJT 314 may include a collector 318 (FIG. 3) having a n-doped buried layer 402 that abuts and forms a PN junction with the substrate 400, a deep-N sinker 404 formed in and above the n-doped buried layer 402, a lightly n-doped well 405 above the n-doped buried layer 402, a deep n-sinker 406 formed in and above the n-doped buried layer 402, and a lightly n-doped well 407 above the n-doped buried layer 402. The collector also includes a shallow n-doped well 408 above the deep-N sinker 404, a shallow n-doped well 410 above the deep n-sinker 406, a heavily n-doped contact diffusion 412 above the shallow n-doped well 408, and a heavily n-doped contact diffusion 414 above the shallow n-doped well 410. Tungsten plugs 416 are coupled to the heavily n-doped contact diffusion 412 and to a metal layer 418. Similarly, tungsten plugs 420 are coupled to the heavily n-doped contact diffusion 414 and to a metal layer 422.

The BJT 314 may include a base 316 (FIG. 3) that includes a p-type buried layer 424 above and abutting the n-doped buried layer 402, a lightly p-doped epitaxial layer 426 above the p-type buried layer 424, a shallow p-doped well 428 above the p-type buried layer 424, a heavily p-doped contact diffusion 430 above the shallow p-doped well 428, a shallow p-doped well 432 above the p-type buried layer 424, and a heavily p-doped contact diffusion 434 above the shallow p-doped well 432. Tungsten plugs 436 are coupled to the heavily p-doped contact diffusion 430 and to a metal layer 438. Tungsten plugs 440 are coupled to the heavily p-doped contact diffusion 434 and to a metal layer 442.

The BJT 314 may include an emitter 320 (FIG. 3) that includes a heavily n-doped region 444. Tungsten plugs 446 are coupled to the heavily n-doped region 444 and a metal layer 448.

The BJT 314 may include a deep trench side wall 450, a heavily p-doped contact 452 above the side wall 450, and tungsten plugs 454 that are coupled to the heavily p-doped contact 452 and to a metal layer 456. Similarly, the BJT 314 may include a deep trench side wall 458, a heavily p-doped contact diffusion 460, and tungsten plugs 462 that are coupled to the heavily p-doped contact diffusion 460 and a metal layer 464. The BJT 314 includes a shallow trench isolation layer 466, a nitride liner 468, and an oxide layer 470 through which the tungsten plugs 416, 420, 436, 440, 446, 462, and 468 extend. The metal layer 418 is adapted to be coupled to the voltage source 302 (FIG. 3). The metal layer 438 is coupled to node 306 (FIG. 3). The metal layer 448 is coupled to node 308 (FIG. 3). The metal layer 442 is coupled to node 306 (FIG. 3). The metal layer 422 is adapted to be coupled to voltage source 302 (FIG. 3).

Referring to FIGS. 3 and 4, in operation at room temperature, the current source 300 and current source 310 provide currents I1 and I2 respectively, with I2 being greater than I1. For example, I1 may be 1 microamp (uA), and I2 may be 2 uA. Thus, in this example, the current source 300 provides 1 uA to the temperature sensing circuit 104, and the current source 310 sinks 2 uA to ground 312. Because the base 316 receives a negligible amount of current, if any, and thus I1 flows through the resistor 304 (e.g., 500 kilohms), generating a voltage VBE from the base 316 to the emitter 320 (in this example, VBE may be approximately 0.5 V). Because VBE is fixed at a relatively low voltage such as 0.5 V, the emitter 320 may provide substantially less current than I1 or I2. For example, at room temperature, the current provided by the emitter 320 may be approximately 1 nano Amp (nA). In this example, the current source 310 is to sink 2 uA to ground 312, and it receives 1 uA from current source 300, but of the remaining 1 uA that the current source 310 is to sink to ground 312, only 1 nA is available from the emitter 320. Consequently, the current source 310 (e.g., a one-quadrant current source) pulls the node 308 low enough toward ground so the voltage at node 308 causes the Schmitt trigger 322 to provide a digital bit 0 on the output 326.

As the ambient temperature rises, the VBE to sustain a constant current decreases. For example, for each 1 degree Celsius increase in temperature, the VBE to sustain a constant current decreases by 2 mV. However, because VBE is fixed, a rise in temperature causes a rise in current. As temperature continues to rise, the BJT 314 continues to increase the amount of current provided to the current source 310. Eventually, the temperature rises to a level at which the current source 310 is sinking the full amount of current it was designed to sink (e.g., 2 uA, with 1 uA from the current source 300 and the other 1 uA from the BJT 314). At this level, the node 308 still remains low, and the Schmitt trigger 322 still provides a digital bit 0 at output 326. However, as the temperature rises even further, the current source 310 is no longer able to sink the continued increase in current provided by the BJT 314. Thus, the extra current causes the voltage at node 308 to rise. As the voltage at node 308 rises with increasing temperature, the voltage at node 306 rises, because VBE remains static at approximately 0.5 V in this example. However, the voltage at node 306 cannot rise indefinitely, because the current source 300 (e.g., a one-quadrant current source) cannot pull node 306 above VCC. Thus, the node 306 will stop rising at VCC, and thus the node 308 has a maximum voltage of VCC less the VBE drop across the BJT 314 (e.g., 0.5 V) and less the saturation voltage (e.g., 0.2 V) of current source 300 (e.g., VCC−(0.5 V)−(0.2 V), or VCC−(0.7 V)). This voltage is sufficiently high to cause the Schmitt trigger 326 to provide a digital bit 1 on the output 326. The Schmitt trigger 322 has a hysteresis with high and low thresholds to mitigate jitter at output 326.

During the operation described above, the high temperature, high currents, and high noise in the switching power circuit 102 (FIGS. 1 and 2) may introduce substantial minority carrier currents and noise currents into the heavily n-doped buried layer 402 via the collector-substrate junction at the top of the substrate 400 (FIG. 4). However, because the collector 318 is coupled directly to the voltage source 302 (FIGS. 3 and 4), and further because the collector 318 provides a low-impedance pathway to the voltage source 302, the noise and minority carrier currents flow to the voltage source 302 and have minimal or no impact on the operation of the temperature sensing circuit 104. Further, as FIG. 3 shows, the emitter 320 is coupled to the Schmitt trigger 322 and is thus potentially vulnerable to noise and minority carrier currents. However, as FIG. 4 shows, because the emitter (the heavily n-doped region 444) is positioned far from the substrate 400 and the collector-substrate junction, no noise or minority carrier currents can reach the emitter. For example, as FIG. 4 shows and as described above, the base and the collector are between the emitter and the substrate 400, and thus the base and collector separate the emitter from the substrate 400 and prevent noise and minority carrier currents from reaching the emitter. Accordingly, even though the emitter is vulnerable to noise and minority carrier currents, these currents cannot reach the emitter, and thus these currents do not materially impact the function of the temperature sensing circuit 104.

Figure 5:
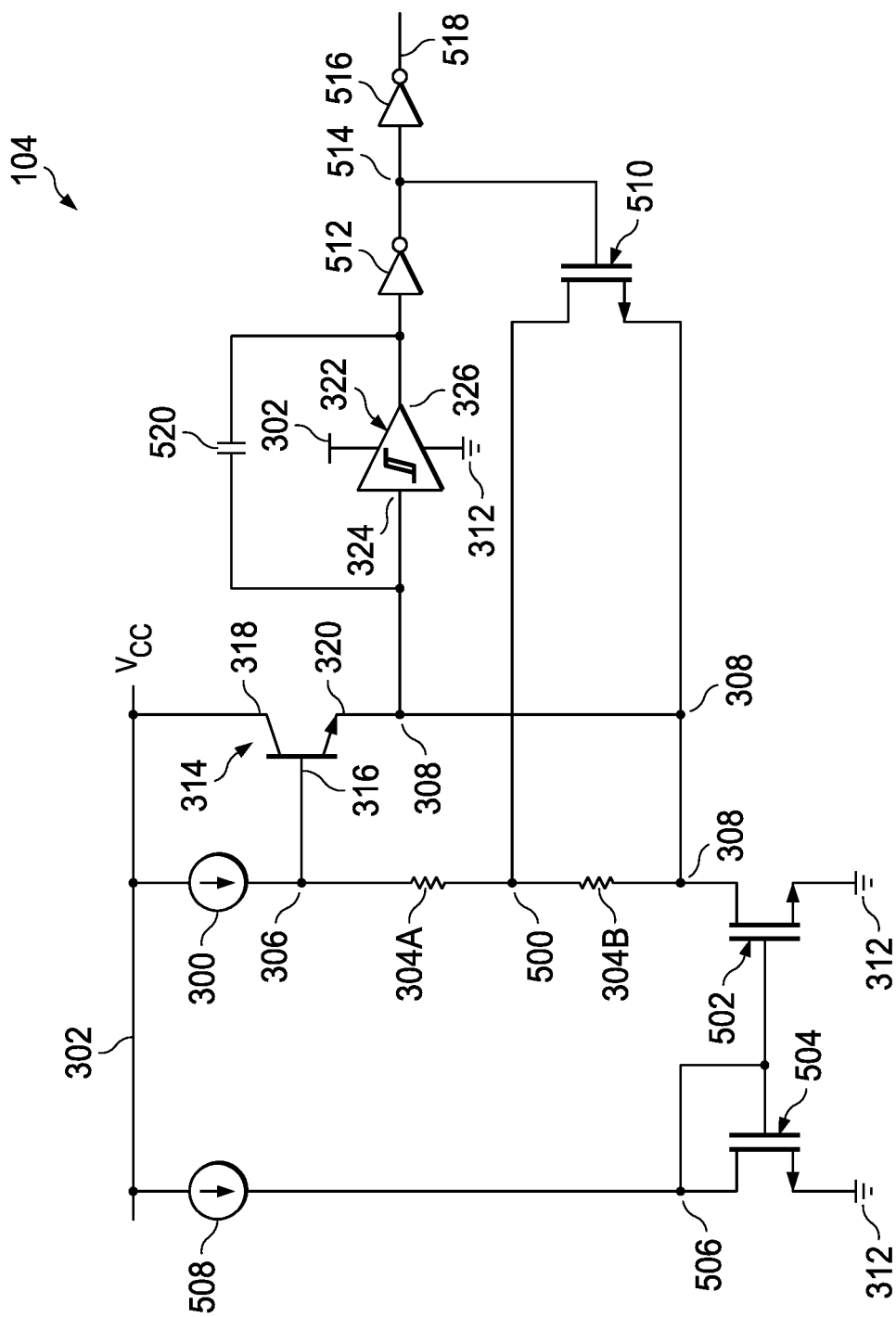
FIG. 5 is a circuit schematic diagram of a temperature sensing circuit in various examples.

FIG. 5 is a circuit schematic diagram of the temperature sensing circuit 104 in various examples. The temperature sensing circuit 104 of FIG. 5 includes the same components as that of FIGS. 3-4, with the following modifications. The resistor 304 is shown in FIG. 5 as including two separate resistors 304A and 304B coupled to each other at a node 500. Node 308 is coupled to the drain of a transistor (e.g., n-type FET) 502, which has a gate that is coupled to the gate of another transistor (e.g., n-type FET) 504. The transistors 502 and 504 combine to form a current mirror. The sources of the transistors 502 and 504 are coupled to ground 312. A node 506 is coupled to the gates of the transistors 502 and 504, the drain of the transistor 504, and a current source 508. A transistor (e.g., n-type FET) 510 has a drain coupled to node 500 and a source coupled to node 308. An inverter 512 is coupled to the output 326, and the gate of the transistor 510 is coupled to the inverter 512 at a node 514. An inverter 516 is coupled to the node 514 and has an output 518. A capacitor 520 is coupled to output 326 and to input 324 to smooth jitter in the output of the Schmitt trigger 322.

The operation of the temperature sensing circuit 104 in FIG. 5 is the same as that in FIGS. 3-4, with the following exceptions. The current source 508 provides a current to the transistor 504, and the current mirror configuration of the transistors 502 and 504 causes a current to be provided in the transistor 502. The current mirror sinks current to ground 312. The current source 300 provides some of this current, with the BJT 314 providing the remainder of the current. At room temperature, the current provided by the BJT 314 is low, and thus the current mirror pulls the voltage at node 308 low. Because the voltage at node 308 is low, the Schmitt trigger 322 provides a digital bit 0 at output 326. The pair of inverters 512, 516 provides a digital bit 0 at output 518. As the temperature rises, the current provided by the BJT 314 increases, and as this current increases, the current mirror is closer to satisfying its target sink current, as described above. After the current mirror is sinking a target amount of current, further temperature increases and the resulting increases in current provided by the BJT 314 cause the voltage at node 308 to rise. As this voltage at node 308 rises, it eventually reaches a level that exceeds a threshold of the Schmitt trigger 322, causing the Schmitt trigger 322 to provide a digital bit 1 at output 326. The pair of inverters 512 and 516 provides a digital bit 1 at output 518.

The transistor 510 is optional. Responsive to the Schmitt trigger 322 providing a digital bit 0 at output 326, the inverter 512 provides a digital bit 1 at node 514, causing the transistor 510 to turn on. Responsive to being on, the transistor 510 forms a short across the resistor 304B, thus eliminating resistor 304B from the temperature sensing circuit 104. However, responsive to the Schmitt trigger 322 providing a digital bit 1 at output 326, the inverter 512 provides a digital bit 0 at node 514, causing the transistor 510 to turn off. Responsive to the transistor 510 being off, the resistor 304B is introduced to the temperature sensing circuit 104. The resistances of the resistors 304A and 304B combine to raise the voltage VBE. Increasing VBE adds hysteresis to the temperature sensing circuit 104 beyond that provided by the Schmitt trigger 322. Specifically, raising the voltage VBE reduces the temperature at which the BJT 314 conducts enough current to raise node 308 high. Therefore as the temperature rises, it first reaches one threshold TH at which the output of the circuit goes high with only resistor 304A present. The output will remain high until the temperature drops below a second, lower, threshold TL corresponding to the insertion of both resistors 304A and 304B in the circuit by turning off transistor 510. The difference between thresholds TH and TL constitutes hysteresis. It is not necessary to use a Schmitt trigger in this case because the hysteresis provided by 510 is larger than that provided by the Schmitt trigger, but it may be advantageous to use a Schmitt trigger even in this case because it helps reject high-frequency jitter. A usual Schmitt trigger has an upper threshold voltage of about two-thirds of its supply voltage from voltage source 302, and a lower threshold of about one-third of this supply voltage. These thresholds may be adjusted by changing transistor sizes within the Schmitt trigger, and by this it is possible to ensure that the upper threshold lies significantly lower than the voltage at which node 308 resides at high temperatures. Similarly, the lower threshold of the Schmitt trigger can be placed well above the saturation voltage of the current source formed by transistors 504 and 502, which approximately equals the voltage on node 506 minus the threshold voltage of transistor 502 (which is assumed to equal the threshold voltage of transistor 504). The threshold temperature in each case equals the temperature at which the transistor conducts just sufficient current to pull node 308 high. The base-emitter voltage to pull a given current through the transistor decreases by about two millivolts per degree Celsius. Thus, the voltage generated by resistors 304A and 304B combined will provide a lower temperature threshold than resistor 304A alone.

Because the Schmitt trigger and current source described above are coupled to the emitter, and because the emitter is distanced from the substrate, the negative impacts caused by proximity to the substrate do not affect the base, the emitter, or the components (e.g., Schmitt trigger) coupled to the base or the emitter. Furthermore, although substrate noise and minority carriers may cross the collector-substrate junction, the collector is coupled to the voltage source through a relatively low impedance path. This low impedance permits the collector to source or sink displacement or minority-carrier currents crossing the collector-substrate junction without causing substantial variation in collector voltage and therefore without coupling substantial noise into either the base or the emitter of the transistor. Consequently, the substrate noise and minority carriers do not adversely impact other components in the temperature sensor and thus do not adversely impact temperature sensing accuracy.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A circuit, comprising:
   a voltage source terminal;
   a first current source coupled to the voltage source terminal;
   a resistor having a first resistor terminal and a second resistor terminal, the first resistor terminal coupled to the first current source;
   a bipolar transistor having a base, a collector, and an emitter, the base coupled to the first resistor terminal, the emitter coupled to the second resistor terminal, and the collector coupled to the voltage source terminal;
   a second current source having a first terminal coupled to the emitter and the second resistor terminal, and a second terminal coupled to a ground terminal; and
   a Schmitt trigger having an input coupled to the emitter, the second resistor terminal, and the second current source.

2. The circuit of claim 1, wherein the circuit is configured to determine whether a temperature of a power circuit has exceeded a threshold.

3. The circuit of claim 1, further comprising a capacitor coupled to the input of the Schmitt trigger and to an output of the Schmitt trigger.

4. The circuit of claim 1, wherein the emitter includes an n-doped region, the collector includes an n-doped buried layer, and the base separates the n-doped region from the n-doped buried layer.

5. The circuit of claim 4, wherein the bipolar transistor is an npn bipolar junction transistor and includes a substrate abutting the n-doped buried layer of the collector.

6. The circuit of claim 1, wherein the collector includes an n-doped buried layer and an n-doped well, and wherein the n-doped buried layer and the n-doped well are configured to provide minority carriers to the voltage source terminal.

7. The circuit of claim 5, wherein the emitter is positioned sufficiently far from the substrate to prevent noise from an n-doped buried layer from interfering with a signal at the emitter.

8. A circuit, comprising:
   a first current source having first and second current source terminals, wherein the first current source terminal is coupled to a voltage source terminal;
   a resistor coupled to the second current source terminal;
   a second current source coupled to the resistor and coupled to a ground terminal;
   a Schmitt trigger having an input coupled to the second current source and a power terminal coupled to the voltage source terminal; and
   a bipolar transistor including:
      an emitter including an n-doped region and an emitter contact coupled to the n- doped region, the emitter contact coupled to the resistor, the second current source, and the Schmitt trigger;
      a base including a p-doped epitaxial layer, a p-doped buried layer, a p-doped well positioned in the p-doped epitaxial layer, and a base contact coupled to the p-doped well, wherein the base contact is coupled to the first current source and the resistor;
      a collector separated from the emitter by the base, the collector including an n-doped buried layer, a first n-doped well, and a collector contact coupled to the first n-doped well, the collector contact coupled to the voltage source terminal; and
      a substrate layer abutting the n-doped buried layer.

9. The circuit of claim 8, wherein the base and the collector separate the substrate layer from the emitter.

10. The circuit of claim 8, wherein the collector is configured to provide minority carriers received from the substrate layer to the voltage source terminal.

11. The circuit of claim 8, wherein the bipolar transistor is an npn bipolar junction transistor.

12. The circuit of claim 8, further comprising a capacitor coupled in parallel with the Schmitt trigger.

13. The circuit of claim 8, further comprising:
   an inverter coupled to the Schmitt trigger; and
   a field effect transistor (FET) having a gate, a source, and a drain, the gate coupled to the inverter, the source coupled to the second current source, and the drain coupled to the resistor.

14. The circuit of claim 13, wherein the resistor is a first resistor, and further comprising a second resistor coupled to the Schmitt trigger, the second current source, the source, the drain, and the first resistor.

15. The circuit of claim 8, wherein the second current source is a current mirror.

16. A system, comprising:
   a thermal protection device;
   a switching power circuit coupled to the thermal protection device; and
   a temperature sensing circuit positioned inside the switching power circuit, the temperature sensing circuit including:
      a bipolar transistor having a base, an emitter, and a collector, the collector coupled to a voltage source terminal;
      a first current source coupled to the base and coupled to the voltage source terminal;

first and second resistors coupled to the base;
a Schmitt trigger coupled to the emitter and to an inverter;
a transistor having a transistor gate, a transistor drain, and a transistor source, the transistor gate coupled to the inverter, the transistor drain coupled to the first and second resistors, the transistor source coupled to the second resistor and the emitter;
a current mirror coupled to the second resistor, the emitter, and the transistor source, the current mirror coupled to a ground terminal; and
a second current source coupled to the current mirror and coupled to the voltage source terminal.

17. The system of claim 16, wherein the bipolar transistor is an npn bipolar junction transistor.

18. The system of claim 16, wherein the bipolar transistor includes a substrate, the collector abuts the substrate, the base abuts the collector, and the emitter abuts the base, the base and the collector separating the emitter from the substrate.

19. The system of claim 18, wherein the collector is configured to provide minority carriers from the substrate to the voltage source terminal.

20. The system of claim 18, wherein the collector is configured to provide noise currents from the substrate to the voltage source terminal.

\* \* \* \* \*